United States Patent

Williams et al.

[11] Patent Number: 5,287,018
[45] Date of Patent: Feb. 15, 1994

[54] DYNAMIC PLA TIME CIRCUIT

[75] Inventors: Clark R. Williams; William J. Podkowa, both of Plano, Tex.

[73] Assignee: Dallas Semiconductor Corporation, Dallas, Tex.

[21] Appl. No.: 18,360

[22] Filed: Feb. 16, 1993

Related U.S. Application Data

[63] Continuation of Ser. No. 827,552, Jan. 28, 1992, abandoned, which is a continuation of Ser. No. 587,953, Sep. 25, 1990, abandoned.

[51] Int. Cl.$^5$ .................................. H03K 19/177
[52] U.S. Cl. ..................... 307/465; 307/469; 307/481
[58] Field of Search ............... 307/443, 465, 468–469, 307/481; 340/825.83, 825.87; 365/189.08, 203, 233

[56] References Cited

U.S. PATENT DOCUMENTS

| | | | |
|---|---|---|---|
| 4,611,133 | 9/1986 | Peterson et al. | 307/465 |
| 4,697,105 | 9/1987 | Moy | 307/465 |
| 4,760,290 | 7/1988 | Martinez | 307/481 X |
| 4,764,691 | 8/1988 | Jochem | 307/468 |
| 4,959,646 | 9/1990 | Podkowa et al. | 307/465 X |
| 4,990,801 | 2/1991 | Caesar et al. | 307/443 X |
| 5,021,690 | 6/1991 | Linz | 307/465 |

Primary Examiner—David R. Hudspeth
Attorney, Agent, or Firm—Worsham, Forsythe, Sampels & Wooldridge

[57] ABSTRACT

A dynamic PLA timing circuit in a PLA ROM includes a PLA line and the address section only of another PLA line. The address section of the first PLA line is connected to the true address lines and the address section of the other PLA line is connected to the complementary address lines. Shorting bars connecting the two PLA lines are formed around each pair of true and complementary address lines such that a conductive path is formed through the address sections for any address into the ROM. The data section is connected to the gates of every data transistor. However, the drains of all but one of the data transistors are not connected to their associated data line. The data line that is connected to the associated data transistor forms the output terminal of the timing circuit.

4 Claims, 3 Drawing Sheets

DYNAMIC PLA TIME CIRCUIT

This is a continuation of application Ser. No. 827,552, filed Jan. 28, 1992, abandoned which is a continuation of application Ser. No. 587,953, filed Sep. 25, 1990 abandoned.

REFERENCE TO RELATED APPLICATIONS

Reference is made to a first related application entitled "DYNAMIC CMOS BUFFER FOR LOW CURRENT SWITCHING," Ser. No. 208,287 filed Jun. 17, 1988 and now U.S. Pat. No. 4,876,465 in the name of Podkowa, William J. and Williams, Clark R. and to a second related application entitled DELAY CIRCUIT PROVIDING SEPARATE POSITIVE AND NEGATIVE GOING EDGE DELAYS, Ser. No. 208,288 filed Jun. 17, 1988 and now abandoned in the names of Podkowa, William J. and williams, Clark R. These applications disclose and claim a CMOS buffer for use with a low slew rate input signal and a one shot circuit respectively which are used in the preferred embodiment of the present invention.

TECHNICAL FIELD

The present invention relates to timing circuits, and more particularly, to dynamic PLA timing circuits.

BACKGROUND OF THE INVENTION

Dynamic PLA read-only memories include a matrix of PLA lines and address/data lines. For example, the PLA lines may be laid out in rows with the address and data lines forming columns of the matrix. The PLA operates by precharging the PLA lines and the data lines in a precharge operation which is then followed by an evaluate operation in which the PLA lines enabled by the present address provide a logic 1 level in the data section of the memory which operates to discharge the data lines coupled to the enabled PLA lines by n-channel pull down transistors. Thus, the selected data lines, which were precharged to a logic 1 level, are pulled to ground potential by the selected PLA lines. After the data lines have stabilized, the logic level on the data lines is captured in a latch.

A critical timing operation is the latching of the state of the data lines. The state of the data lines does not change immediately when the evaluation operation begins due to the capacitance on the PLA lines and the data lines. Also, due to the leakage, the non-selected data lines which will eventually lose their charge and become a logic 0 level even though not selected in the current read operation. Therefore, the logic state of the data lines must be captured in a latch within an appropriate time window after the evaluate operation begins.

This delay time, between the start of the evaluation cycle and the time window when the correct data is on the data lines, is a function of the manufacturing process and therefore varies from manufacturing lot to manufacturing lot. Also, in certain systems, an appropriate external clock pulse, which is normally used to provide this timed delay, is not readily available.

Therefore, it can be appreciated that a dynamic PLA timing circuit which compensates for manufacturing process variations and which does not require an external clock is highly desirable.

SUMMARY OF THE INVENTION

It is therefore an object of this invention to provide a dynamic PLA timing circuit which compensates for variations in the manufacturing process and which does not require an external clock signal.

Shown in an illustrated embodiment of the invention is a timing apparatus for use with a memory device which includes PLA line having a series combination of a precharge transistor, an address section, and a data section, the data section being connected to the control terminal of a switching device coupled to a data line, the data line forming the output of the timing apparatus. The timing apparatus also includes at least one additional address section of a PLA line and also includes shorting strips connected from various portions of the address section of the PLA line to the corresponding places on the at least one additional address section such that the PLA line is conductive from the precharging transistor to the data line for any address into the memory device.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 3:
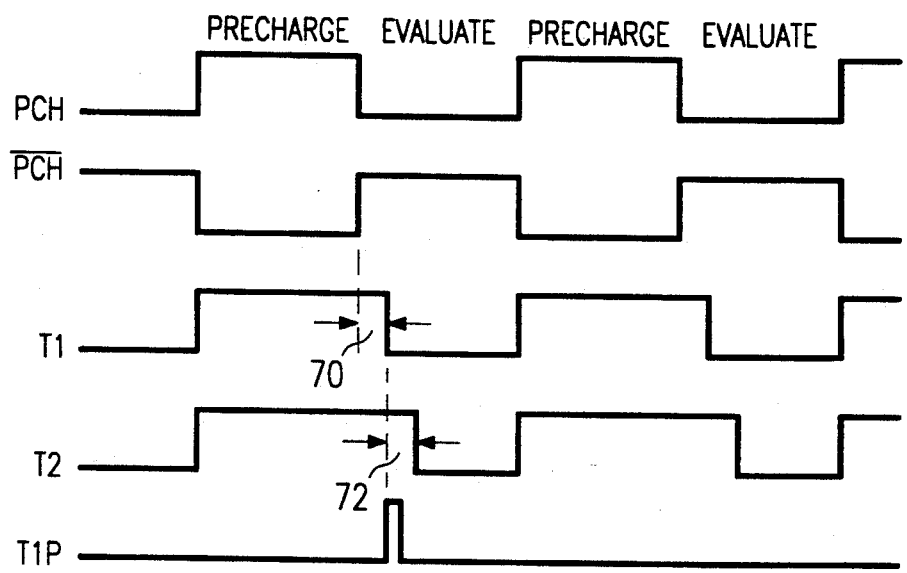
FIG. 3 is a timing diagram showing the timing relationship of various signals in FIG. 1 and FIG. 2.

It will be appreciated that for purposes of clarity and where deemed appropriate reference numerals have been repeated in the figures to indicate corresponding features, and that the pulse times shown in FIG. 3 have not necessarily been drawn to scale in order to more clearly show timing relationships in the preferred embodiment of the present invention.

DESCRIPTION OF THE PREFERRED EMBODIMENT

The dynamic PLA timing circuit in the preferred embodiment is used in a dynamic PLA ROM. The timing circuit consists of one PLA line connected in parallel with the address section of the second PLA line. In the full PLA line one of each pair of true and complementary address lines makes contact in the address portion of the PLA line, and the other of each pair of true and complementary address lines makes contact to the address section of the second PLA line. In the data section of the PLA line contact is made with the gates of all of the data transistors associated with each of the data lines, but significantly the drain of all of these transistors, except one, is disconnected from its associated data line. The data line making contact with the drain of the transistor gated by the PLA line forms the output signal of the timing circuit. The address portion of the first PLA line and the address portion of the second PLA line are shorted together on either side of each pair of true and complementary address lines. Thus, for any address combination into the ROM, a conductive path is formed through the address portion of the combination of the first PLA line and the second truncated PLA line.

A read operation begins with a precharge cycle in which a p-channel transistor coupled between the address section of the PLA lines and VCC is turned off or made nonconductive while an n-channel transistor connected to the data portion of the PLA lines is made conductive thereby causing the PLA lines to be at ground potential. When the PLA ROM switches from the precharge mode to the evaluation mode, the n-channel transistor is first turned off and then the p-channel transistor is then turned on or made conductive which allows the addressed PLA line to begin charging toward VCC. The PLA lines have distributed capacitance associated with them and each gate connection of the PLA lines adds additional distributed capacitance to the lines which in turn slows down the charging of the PLA lines toward VCC. Since the timing PLA line in combination with the truncated PLA line have gate connections to all of the address lines and since the timing PLA line also has gate connections to each of the data line transistors, the PLA timing line has a capacitance greater than any of the other PLA lines in the array. The voltage potential on the timing PLA line or data line will always lag the rising voltage on the other PLA lines and thus when the data line controlled by the timing PLA line switches from a logic 1 to a logic 0 condition, all of the other data lines will have stabilized by that time. Thus the output of this timing circuit is used to latch the data from the other data lines into their respective latch circuits.

Also in the preferred embodiment of the invention, the output of a first timing PLA line is used to control the p-channel precharge transistor of a second timing PLA circuit to form a second time delay pulse which is delayed from the output of the first timing circuit by the same time delay as the first timing circuit.

Figure 1:
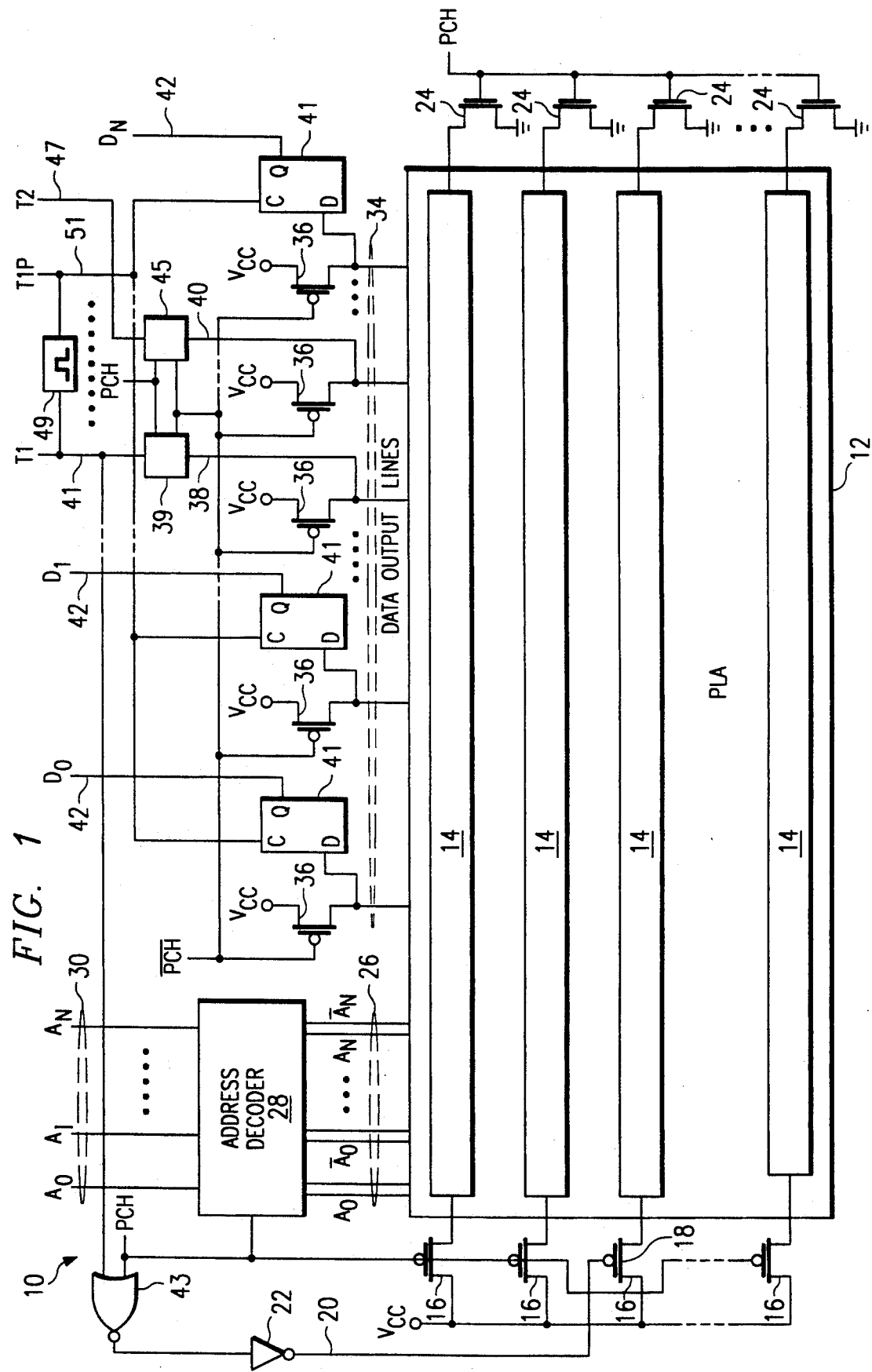
FIG. 1 is a block diagram of a dynamic PLA ROM containing a timing circuit according to the present invention.

Turning now to the drawings, FIG. 1 shows a dynamic PLA ROM 10 which includes timing circuitry according to the present invention. The PLA ROM 10 includes a PLA array 12 which, in the preferred embodiment, has PLA lines 14 arranged as rows in the PLA array 12. Each of the PLA lines 14 is coupled to VCC through the drain and source terminals of a p-channel precharge transistor 16. Each of the p-channel precharge transistors 16 except one, shown as 18 in FIG. 1, has its gate connected to a precharge signal PCH. The precharge transistor 18 has its gate connected to a signal line 20 which is connected to the output of an inverter 22. The other end of each of the PLA lines 14 is connected to the drain of an n-channel precharge transistor 24. The sources of the n-channel precharge transistors 24 are connected to ground and the gates are connected to the precharge signal PCH.

The columns of the PLA array 12 are divided into two sections, the first being an address section having address column lines 26 which are driven by an address decoder circuit 28. The address decoder circuit 28 receives address inputs on the address lines 30 and provides true and complementary address lines 26 for each of the input address lines 30. The address decode circuit 28 also receives the PCH precharge signal. The second section of the columns of the PLA array 12 are the data output lines 34, each of which is connected through a p-channel precharge transistor 36 to VCC. The gates of the p-channel precharge transistors 36 are connected to a precharge signal $\overline{PCH}$. All of the data lines 34, except for the two data lines 38 and 40, are connected to the D input of a latch circuit 41. The Q outputs of the latches 41 form the data output lines 42 of the dynamic PLA ROM 10. The signals PCH and $\overline{PCH}$ are generated by circuitry not shown in the drawings but well known to those skilled in the art.

The data line 38 is connected to the input of a dynamic buffer circuit 39. The dynamic buffer circuit 39 in the preferred embodiment is described in the aforementioned patent application entitled "DYNAMIC CMOS BUFFER FOR LOW CURRENT SWITCHES" which is hereby incorporated by reference. The output of the dynamic buffer circuit 39 forms the T1 signal on line 41. Line 41 is connected to one input of a NOR gate 43, the output of which is connected to the input of the inverter 22. A second input of the NOR gate 43 is connected to PCH.

The T1 line 41 is also connected to the input of a one shot 49. The one shot 49 in the preferred embodiment is described in the aforementioned patent application entitled DELAY CIRCUIT PROVIDING SEPARATE POSITIVE AND NEGATIVE GOING EDGE DELAYS and which is incorporated herein by reference. The one shot 49 is triggered by a falling edge on its input, and provides a positive pulse at its output. The output of the one shot 49 forms the T1 pulse on a line 51 which is connected to the clock inputs of each of the latch circuits 41.

The data line 40 is connected to another dynamic buffer circuit 45, the output of which forms the T2 signal on line 47.

Figure 2:
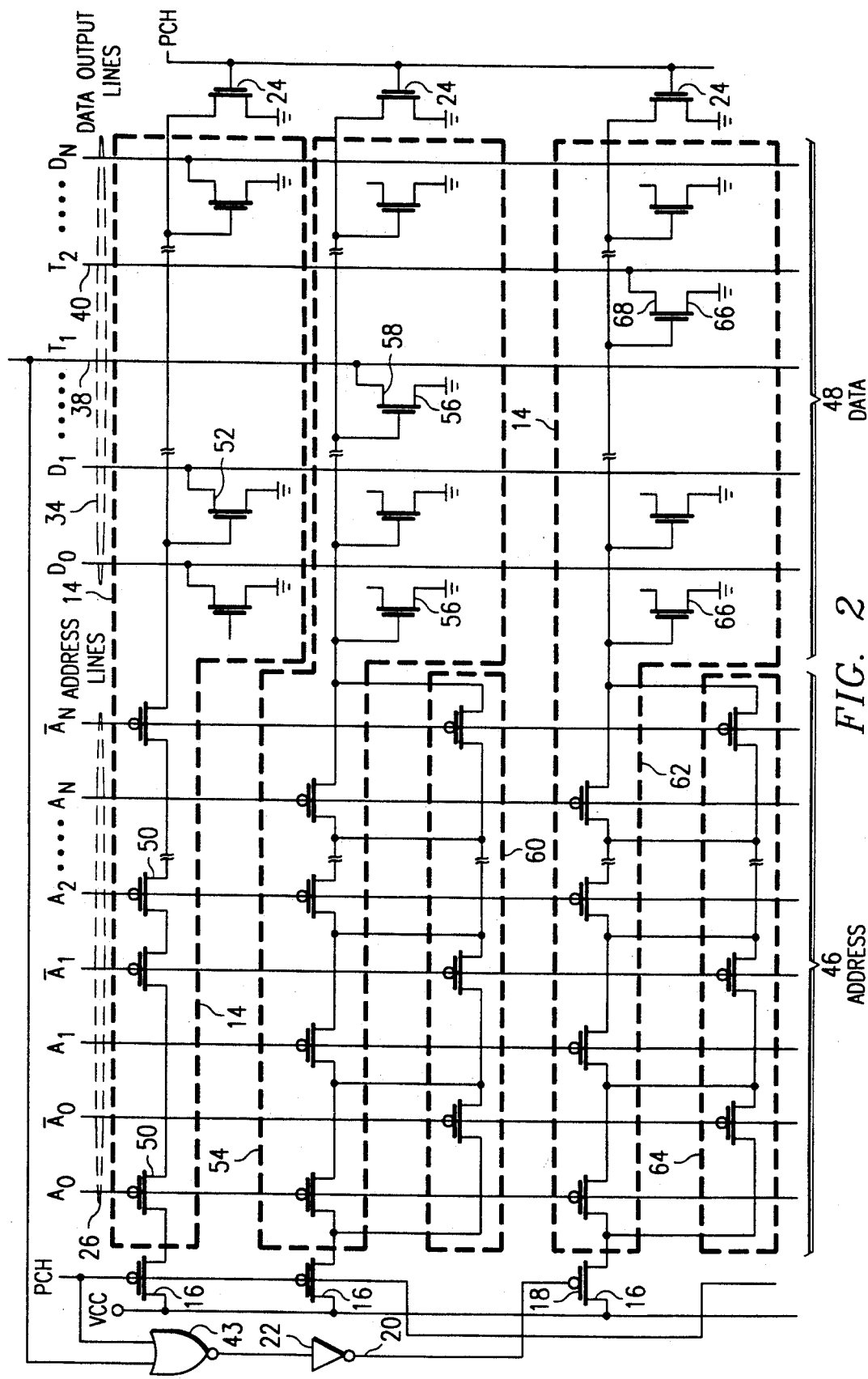
FIG. 2 is a schematic diagram of a portion of the PLA matrix showing a timing circuit according to the present invention.

FIG. 2 is a schematic diagram of a portion of the PLA array 12. The top PLA line 14 in FIG. 2 is a standard PLA ROM line which has an address section 46 and a data section 48. The ROM PLA line 14 address section 46 is comprised of a series connection of p-channel transistors 50 which are connected to selected address lines 26. The data section 48 of the ROM PLA line 14 is connected to the control terminals or gates of selected data transistors 52 which have their drains connected to their associated data lines 34 and their sources connected to ground.

Also shown in FIG. 2 are two timing circuits. The first timing circuit includes a PLA line 54 which has connections to each of the true address lines in the address section 46 and which has connections to the gates of each of the data line transistors 56. All except one of the data line transistors 56 does not have a connection between its drain and its associated data line 34. The one exception is the data line transistor 58 which has its drain connected to the data line 38 which is coupled through the dynamic buffer circuit 39 to form the T1 timing signal. Connected in parallel with the PLA line 54 is a truncated second PLA line 60. The truncated PLA line 60 includes only the address portion 46 of the PLA line and makes connection to each of the complementary address lines 26. The address portion of the PLA line 54 and the truncated PLA line 60 are shorted together on either side of each pair of true and complementary address lines.

Similarly, a second timing circuit is composed of another PLA line 62 and a second truncated PLA line 64. The data section 48 of the truncated PLA line 62 is also connected to each gate of its associated data transistors 66, all of which except one have no connection between their drain and their associated data line 34. The one data line transistor 68 which is connected to the data line 40 which, in turn, is coupled through the dynamic buffer circuit 45 to form the T2 timing signal.

The address sections of the PLA line 62 and the truncated PLA line 64 are connected the same as the address sections of the PLA line 54 and its associated truncated PLA line 60.

In operation, and with reference now to FIG. 3, the PLA ROM of the preferred embodiment begins with a precharge cycle in which the p-channel precharge transistor 16 are made nonconductive and the n-channel precharge transistors 24 are made conductive thereby pulling the data section 48 of the PLA lines to ground potential. At the same time the address decode circuit 28 captures the data on the address line 30 and provides the true and complementary address pairs 26 into the address section 46 of the PLA array 12. Also at this time the p-channel precharge transistors 36 connected to each of the data lines 34 are enabled to precharge each of the data lines 34 to VCC.

When the precharge signal PCH and $\overline{PCH}$ switch to the evaluate cycle of the ROM operation as shown in FIG. 3, then the p-channel precharge transistors 16 are enabled and the n-channel precharge transistors 24 are disabled. At the same time the p-channel precharge transistors 36 connected to the data lines are disabled thereby isolating the VCC charge on the data lines 34. In the standard PLA ROM line 14 if the address lines 26 connected to the series address transistors 50 are all at a logic 0 level, then the VCC voltage will propagate down the address section of the PLA line 14 and cause the PLA line 14 in the data section 48 to go to VCC. The VCC voltage will enable each of the data transistors 52 connected to the PLA line 14 which will thereby discharge their associated data lines 34. If one of the address lines connected to the series p-channel transistors 50 in the address section 46 of the PLA ROM array 14 is not at a logic 0 level, then the VCC voltage will be blocked from the data section 48 of the PLA line 14 and the associated data transistors 52 will remain nonconductive and will not pull down their associated data lines 34.

The first timing circuit consisting of the PLA line 54 and the truncated PLA line 60 in conjunction with their shorting connections between each pair of true and complementary bit lines forms a continuous conductive path between the precharge transistor 16 and the data section 48 of the PLA lines 54. Thus, when the PLA ROM enters its evaluate cycle, the VCC voltage will be applied to the data section 48 for any address into the ROM on the address lines 30. However, the data section 48 of the PLA line 54 will not rise instantaneously but will rise at a rate determined by the capacitance on the PLA line 54 and the truncated PLA line 60. The magnitude of this capacitance is subject to process variations. Since the PLA line 54 and truncated PLA line 60 make contact to every address line 26 and has a contact to the gate of every data transistor 56 and therefore has more capacitance than the PLA ROM lines irrespective of process variations, the voltage rising on the PLA line 54 will rise more slowly than the voltage on any of the PLA ROM lines and thus the data transistor 56 will be enabled later than any other data transistor 52 associated with the PLA ROM lines. Thus, the voltage on the data line 38 will switch from a logic 1 to a logic 0 level at a time when each of the other data lines 34 has stabilized at its voltage and before a time that the data lines 34 which have not been pulled down by a data line transistor will have leaked their charge and assumed a logic 0 voltage level. The falling edge of the signal on the data line 38 is coupled through the dynamic buffer circuit 39 to fire the one shot 49, the output of which latches the data from the other data lines into their respective latch circuits 41.

The signal on the data line 38 is NOR'D with the PCH signal and inverted by the inverter 22 to form the precharge signal at the gate of the p-channel precharge transistor 18 for the T2 data line. Thus, the p-channel precharge transistor 18 is held nonconductive until the T1 data signal falls to a logic 0 level which begins the timing circuit on the PLA line 62. The output of the second timing circuit is on the data line 40. This second timing signal T2 on line 47 is used for timing in other ratioless circuitry on the integrated circuit chip embodying the preferred embodiment of the present invention.

As shown in FIG. 3, the T1 delay time is shown as element 70 and the T2 time delay is shown as element 72.

Thus, there has been shown a dynamic PLA timing circuit which compensates for the manufacturing variations in the PLA ROM circuit and which is able to provide a timing circuit independent of an external clock to the PLA ROM.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A PLA, comprising:
   (a) a plurality of address lines;
   (b) a plurality of data lines including a timing data line;
   (c) a plurality of PLA lines including a timing PLA line and coupling said address lines and said data lines;
   (d) a plurality of latches, each of said latches with data input connected to a corresponding one of said data lines except said timing data line couples to the clock inputs of said latches;
   (e) charge circuitry for said PLA lines;
   (f) wherein said charge circuitry charges said timing PLA line more slowly than all other PLA lines, and said timing PLA line couples to said timing data line to clock said latches.

2. The PLA of claim 1 wherein:
   (a) said timing PLA line is connected to the gate of a pull down transistor for every data line and with the drain of each said pull down transistor not connected to the corresponding data line except for said timing data line; and
   (b) said timing data line drives a one-shot generator which, in turn, drives said clock inputs of said latches.

3. The PLA of claim 1 further comprising:
   (a) a second timing data line;
   (b) a second timing PLA line coupled to said second timing data line; and
   (c) second charge circuitry for said second timing PLA line;
   (d) wherein said timing data line drives said second charge circuitry to charge said second timing PLA line, and said second timing PLA line drives said second timing data line.

4. A self-timed PLA ROM, comprising:
(a) a plurality of address lines;
(b) a plurality of PLA lines crossing said address lines, said address lines selectively drive gates of transistors in said PLA lines;
(c) a plurality of data lines crossing said PLA lines, said PLA lines selectively drive gates of pull down transistors for said data lines;
(d) a timing PLA line in said plurality of PLA lines, said timing PLA line connected to gates of disconnected pull down transistors for each of said data lines;
(e) a timing data line with a connected pull down transistor having a gate connected to said timing PLA line; and
(e) a plurality of latches, each of said latches with data input connected to a corresponding one of said data lines and said timing data line coupled to the clock inputs of said latches.

* * * * *